United States Patent [19]

Burns et al.

[11] Patent Number: 4,684,436

[45] Date of Patent: Aug. 4, 1987

[54] METHOD OF SIMULTANEOUSLY ETCHING PERSONALITY AND SELECT

[75] Inventors: Francis C. Burns, Endicott; Gary R. Carden, Endwell, both of N.Y.

[73] Assignee: International Business Machines Corp., Armonk, N.Y.

[21] Appl. No.: 924,487

[22] Filed: Oct. 29, 1986

[51] Int. Cl.⁴ .......................... B44C 1/22; C23F 1/02; C03C 15/00; B29C 37/00

[52] U.S. Cl. .................................... 156/643; 156/646; 156/656; 156/659.1; 156/668; 156/345; 219/121 LJ; 219/121 LM; 204/192.34; 427/43.1; 427/53.1; 430/5; 430/313; 430/318

[58] Field of Search .................... 430/5, 313, 296, 312, 430/316, 317, 318, 323; 204/192.34; 427/43.1, 53.1; 156/626, 643, 646, 653, 655, 656, 659.1, 661.1, 662, 665, 666, 668, 345; 219/121 L, 121 LH, 121 LJ, 121 LM, 121 FS

[56] References Cited

U.S. PATENT DOCUMENTS

| | | | |
|---|---|---|---|
| 3,649,393 | 3/1972 | Hatzakis | 156/664 X |
| 3,823,015 | 7/1974 | Fassett | 430/5 |
| 3,930,857 | 1/1976 | Bendz et al. | 156/651 X |
| 4,035,522 | 7/1977 | Hatzakis | 430/5 |
| 4,151,072 | 5/1979 | Hutchings | 356/350 |
| 4,415,262 | 11/1983 | Koyama et al. | 430/5 |
| 4,490,210 | 12/1984 | Chen et al. | 156/643 |
| 4,490,211 | 12/1984 | Chen et al. | 156/643 |
| 4,508,749 | 2/1985 | Brannon et al. | 427/43.1 |

Primary Examiner—William A. Powell
Attorney, Agent, or Firm—Mark Levy

[57] ABSTRACT

A method for performing differential etching of material by using electromagnetic radiation. Material having two predetermined regions is provided. A beam of electromagnetic radiation is generated. The energy intensity of predetermined areas within the beam of electromagnetic radiation is selectively varied so that both of the predetermined regions of the material are etched simultaneously and each of the predetermined regions is etched at a rate independent of the etching rate of the other of the predetermined regions. In an alternate embodiment, a substance having at least two materials is provided. A beam of electromagnetic radiation is generated. The energy intensity of predetermined areas within the beam of electromagnetic radiation is selectively varied so that the time required to etch one of the materials is substantially equal to the time required to etch any selected combination of the materials remaining.

39 Claims, 6 Drawing Figures

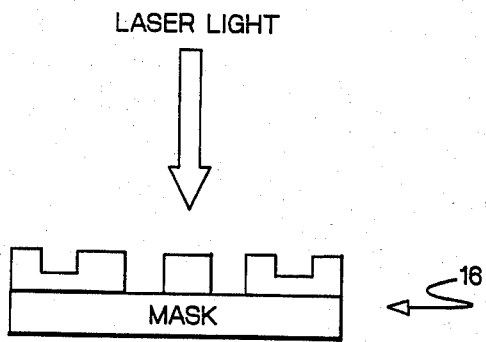
FIG. 3
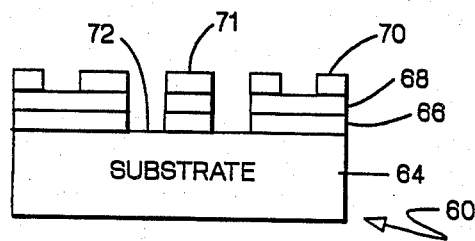

METHOD OF SIMULTANEOUSLY ETCHING PERSONALITY AND SELECT

BACKGROUND OF THE INVENTION

Field of the Invention

The present invention relates to a process of manufacturing electronic components by etching and, more particularly, to a process for differential etching two or more predetermined portions of a semiconductor device or printed circuit board by the use of electromagnetic radiation.

In the field of manufacturing electronic components such as semiconductor devices and fine line printed circuit boards, subtractive processes such as mechanical, chemical or dry (e.g., plasma and/or laser) etching are performed either as a batch process, serially or individually. In any of these techniques, a generally uniform etching results.

When a specified portion of a component (a substrate, for example) is to be etched more than another portion, however, the technique heretofore used has been to etch the specified portion for a greater length of time. Alternatively, two or more etchants can be used or mechanical operations performed sequentially to etch the specified portion more than the remaining portion. Thus, a process involving two or more steps has always been required in order to allow one portion of the material to be etched to a greater extent than another portion thereof.

Similarly, providing two different materials on a substrate, each having a unique etching rate, is a conventional technique that results in one-step etching. But there are drawbacks associated with this technique. For example, two or more etching solutions are often required to effect etching of two or more materials. Such a requirement is susceptible to inadvertent mixing of chemical etchants. Only highly sophisticated methods of separating the etchants from one another are effective.

Another challenge, especially in the field of high resolution substrates, is to maintain required tolerances. This problem can require solutions far beyond the limits of present technology. The separate etchants technique can result in inaccurate etching, so that areas not to be etched are, in fact, etched while areas intended to be etched are not.

Numerous examples of laser or laser-assisted etching are taught in the prior art. For example, U.S. Pat. Nos. 4,490,210 and 4,490,211, both issued to Chen et al and assigned to the present assignee, disclose a system for exposing a metallized substrate by laser radiation in a reaction chamber in the presence of a selected gas chosen to react with the metal to be etched.

Laser beam intensity can be adjusted with the use of partially reflecting dielectric mirrors as taught, for example, in U.S. Pat. No. 4,152,072 issued to Hutchings.

The use of so-called masks to select predetermined portions of a substrate to be etched is also known in the art. A mask is a partially opaque structure that prevents electromagnetic radiation of predetermined wavelength(s) or particle bombardment from impinging upon a surface to be etched. U.S. Pat. No. 4,508,749 issued to Brannon et al and assigned to the present assignee, for example, discloses a system for etching polyimide by use of laser radiation. By using a mask between the laser and the polyimide, only parts of the substrate are etched.

The composition and the fabrication of a mask are extremely critical. For use with a given source of electromagnetic radiation, it would be advantageous for the mask to have at least two portions. The reflectivity of a given wavelength of radiation of one portion of the mask should be distinct from the reflectivity of the other portions of the mask.

It would further be desirable for a mask to have three or more different regions of reflectivity so that the substrate created by selective etching can be etched to three or more different levels. This would be especially valuable when used with substrates having a plurality of layers of material. Thus, for a multi-layered substrate, each layer or certain combinations of layers of the substrate could be etched selectively given the correct mask configuration.

Recently, masks with predetermined areas having a dielectric coating of a specified reflectivity property, different than the reflectivity property of a transparent substrate, have been developed. For example, co-pending U.S. patent application, Ser. No. 924,480 filed concurrently by J. R. Lankard et al and assigned to the present assignee titled "High Energy Laser Mask and Method of Making Same," teaches the use of a dielectric to form a mask having a first reflectivity property of the transparent substrate of the mask and a second reflectivity property of a dielectric coating thereon.

Consider a multi-layered substrate having a base layer of chromium on which is disposed a layer of copper on which is further disposed another layer of chromium. The time needed to etch all three layers of this material—called personality etching—with the use of a high intensity laser can be measured and/or calculated. A mask can be fabricated with certain reflectivity characteristics over a portion thereof. In operation, it would be advantageous for a laser beam to etch the entire three layer material personality for one part of the mask in the same time as the top chromium layer alone—called select etching—is being etched through another portion of the mask. Thus, it would be desirable for the combination of three layers of this multi-layered substrate (personality) and the top chromium layer of the substrate (select) to be etched simultaneously and differentially.

It would be advantageous to provide an electromagnetic radiation based system that would allow a material to be etched differentially.

It would also be advantageous to provide a differential etching system that could accomplish such a result in a one-step process.

Moreover, it would also be advantageous to provide a system for etching two or more materials simultaneously by the use of electromagnetic radiation.

It would further be advantageous to provide a system for etching two or more portions of a substrate simultaneously and differentially regardless of whether the portions are composed of the same material.

It would be advantageous to provide a method of simultaneously etching personality and select of an electronic component.

It would further be advantageous to provide a system that would allow electromagnetic radiation to assist in etching a material differentially as a function of position of the material.

SUMMARY OF THE INVENTION

In accordance with the present invention, there is provided a method for performing differential etching of material by using electromagnetic radiation. A material having two predetermined regions is provided. A beam of electromagnetic radiation is generated to impinge upon the material. The energy intensity of predetermined areas within the beam of the electromagnetic radiation are selectively varied so that both of the predetermined regions of the material are etched simultaneously and each of the predetermined regions is etched at a rate independent of the etching rate of the other of the predetermined regions. In an alternate embodiment of this invention, a method is provided for performing differential etching of a substance by using electromagnetic radiation. The substance to be selectively etched is in operative relation to a beam of electromagnetic radiation. The substance has two materials, each which has a different etch rate. The energy intensity of predetermined areas within the beam of electromagnetic radiation is selectively varied so that each of the materials is etched at the same time.

BRIEF DESCRIPTION OF THE DRAWINGS

A complete understanding of the present invention may be obtained by reference to the accompanying drawings, when taken in conjunction with the detailed description thereof and in which:

FIG. 3 is a schematic view of a mask and corresponding etched substrate resulting from the use of said mask;

DETAILED DESCRIPTION OF THE PREFERRED EMBODIMENT

Figure 1:
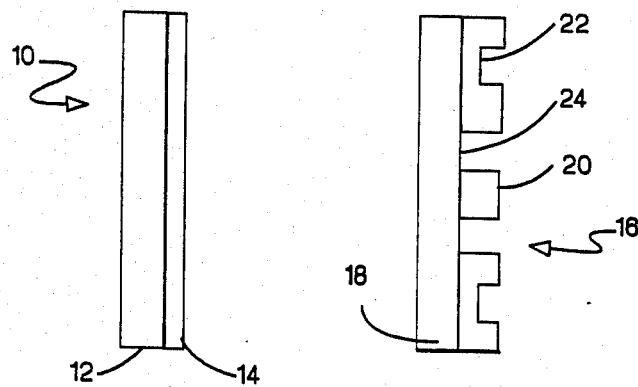
FIG. 1 is a planar cross-sectional view of a mask blank and finished mask in accordance with the present invention.

Referring now to FIG. 1, there is shown a mask blank 10 having a transparent carrier 12 such as synthetic fused silica or any material substantially transparent to the wavelength of electromagnetic radiation being used. It should be understood that a certain amount of radiation is reflected any time such radiation is caused to be transmitted across a discontinuity in refractive index. Disposed on the carrier 12 is dielectric coating 14, commonly referred to as dielectric, such as disclosed in aforementioned co-pending patent application, Ser. No. 924,480, which is herein incorporated by reference. The coating 14 is opaque to electromagnetic radiation. The coating 14 is a series of thin layers, each having a thickness of ¼ the wavelength of the radiation in the medium being used. At these ¼ wavelength thicknesses, it has been found that a substantial amount of light incident on the interface between layers is reflected, when the index of refraction of ¼ wavelength of film is higher than that of the underlying layer. By depositing many layers, any arbitrarily high level of reflectivity can be obtained. The coating 14 can be disposed on the carrier 12 by means of electron beam deposition or by any other method known in the art. Intermediate layers of material may also be required between these thin layers to neutralize the effect of thermal and mechanical stress.

Adjacent to the mask blank 10 in FIG. 1 is a mask 16 fabricated and ready for use in optical or electromagnetic radiation lithography. The mask 16 has a carrier 18 that is chosen so that essentially all of the radiation impinging thereon is transmitted therethrough. Dielectric coating as hereinabove described is disposed, on the carrier 18 reflect light or other electromagnetic radiation either totally or by a percentage of totality. For example, the portion of the dielectric shown at reference numeral 20 disposed on the carrier 18 reflects all laser radiation impinging thereon. However, the portion of the dielectric shown at reference numeral 22 allows a percentage of laser radiation (e.g., 308 nm wavelength) to be transmitted through it and through the carrier 18. In one embodiment, for etching two portions of polyimide with ultraviolet (UV) light, the first portion at an etch rate of 1000 Angstroms per pulse and the second portion at an etch rate of 600 Angstroms per pulse, the reflectivity of the dielectric material at reference numeral 22 is 33.4%. Derivation of this percentage value is shown hereinbelow with reference to FIG. 6. Tables of etch rate versus fluence curves are available for determining the reflectivity of specified portions of the mask 16 in order to etch certain material at a specified rate while etching another material at a second rate. Such curves for polyimides are published, for example, by J. H. Brannon, J. R. Lankard, A. I. Baise, F. Burns and J. Kaufman, in the Journal of Applied Physics 58(5), 1 Sept. 1985, pp 2036–2043. It can be seen that almost all of the radiation impinging on the part of the carrier 18 on which no dielectric material exists 24 will not be reflected therefrom.

It should be understood that the word reflective is a function of the electromagnetic radiation that is used in the system. Thus, while one material may be reflective for one part of the spectrum, (e.g., visible light), another material may be reflective for another part of the spectrum (e.g., ultraviolet light).

For the purposes of this description, personality area or pattern of the mask 16 refers to any area thereof which transmits less light than the carrier 12 at the operating wavelength of a laser. Select area or pattern of the mask 16 refers to any area thereof which transmits a predetermined specified amount of light which is less than the amount of light transmitted by the carrier 12 at the operating wavelength of a laser but more light than does the full thickness dielectric 14. Thus, the select area is a portion of the personality area of the mask 16. A complement of the personality area is that area on a carrier not part of the personality area.

In operation, creating the mask 16 requires the following procedure. To fabricate the personality areas, obtain a carrier 18 with appropriate transmission properties. Coat the carrier 18 with a dielectric material 20 which is totally reflecting at the operating wavelength of a predetermined laser. The dielectric 20 should be resistant to high fluence at the operating wavelength of the laser. Apply, bake, expose and develop a predetermined personality pattern in a photoresist, not shown. Ion mill the exposed dielectric 24 down to the carrier 18. Strip the photoresist.

To fabricate the select areas, apply, bake, expose and develop a predetermined select pattern in a photoresist, not shown. Ion mill the dielectric 22 in the select pattern areas until the dielectric has the desired transmission characteristics at the operating wavelength of the laser. Strip the photoresist. Clean.

In an alternative embodiment, the mask 16 can be fabricated by performing the following steps. Obtain a carrier 18 with appropriate transmission properties. Coat the carrier 18 with a dielectric material 20 which is totally reflecting at the operating wavelength of the laser. Apply, bake, expose and develop the predetermined personality pattern in a photoresist, not shown. Ion mill the exposed dielectric until the transmission of the remaining dielectric 22 is 1−T, where T is the transmission desired for the select areas. Strip the photoresist. Apply, bake, expose and develop the predetermined select pattern in a second photoresist, not shown. Ion mill the exposed dielectric 24, which had been previously milled in the aforementioned ion mill step, to the base carrier 18. All the dielectric is removed from the areas etched in the aforementioned ion milling step. Sufficient dielectric will have been removed from the select areas 22 so that the transmission characteristic in the select areas is that which is desired. Strip the photoresist. Clean.

Figure 2:
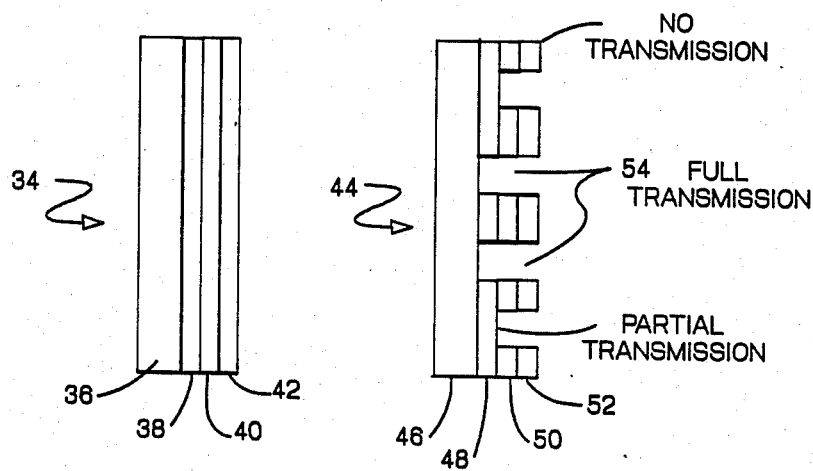
FIG. 2 is a planar cross-sectional view of a three layer mask blank with endpoint detection means and a finished mask.

Referring now also to FIG. 2, there is shown another embodiment of the invention wherein the mask consists of a plurality of layers. A mask blank 34 has a carrier 36 on which is deposited a first material 38 that is partially reflective. Deposited on that first layer 38 is a layer of metal (e.g., chromium) 40 or some other visible material. Adjacent to the metal layer 40 is a third layer 42 of totally reflective dielectric material.

Adjacent to the mask blank 34 is a fabricated mask assembly ready for use in lithography and shown generally at reference numeral 44. The mask assembly 44 has a carrier 46, a first layer of material 48 covering at least a portion thereof, a second layer of material 50 covering at least a portion of the first layer 48 and a third layer of material 52 covering the second layer of material 50 where it exists.

In the preferred embodiment, the material with a lower reflectivity 48 would normally be adjacent to the carrier 46 while the material with the higher reflectivity percentage 52 would be furthest from the carrier 46.

Part of the first layer 48 is absent as are portions of the second and third layers 50, 52. In certain locations 54 no dielectric is on the carrier 46.

Creating the mask 44 having a plurality of layers requires the following procedure. Obtain a carrier 46 with appropriate radiation transmission properties. Coat the carrier 46 with three layers of material with electrical and transmission characteristics as hereinbelow described. The first layer 48 is adjacent to the carrier 46. It is a dielectric which has partial transmission at the operating wavelength of a laser to be subsequently used. The second thin layer 50 is metal such as chromium or aluminum. The third layer 52 is a totally reflecting dielectric at the operating wavelength of the laser. Apply, bake, expose and develop a predetermined personality pattern in a photoresist, not shown. Ion mill the totally reflecting dielectric layer 52, etch the metal layer 50 and ion mill the partial transmission dielectric 48 to expose the carrier 46. Strip the photoresist. Apply, bake, expose and develop a predetermined select pattern in a photoresist. Ion mill the totally reflecting dielectric layer 52 and etch the metal layer 50, both from the select area. Strip the photoresist. Clean.

Referring now also to FIG. 3, there is shown a schematic representation of electromagnetic radiation impinging on a mask 16 and on portions of a metallized substrate 60 aligned therewith.

The substrate 60 is one that has already been etched in accordance with the present invention using a mask 16 such as was hereinabove described with reference to FIG. 1.

The substrate 60 consists of a base 64 such as ceramic, on which is disposed a first layer of material 66 such as chromium, in the preferred embodiment. A second layer 68 such as copper, is disposed on the first layer 66. Finally, a third layer of material 70 such as chromium covers the second layer 68. After etching is complete, portions of the substrate 72 are not covered by any of the additional layers of material 66–70.

In summary, a mask 16 (FIG. 1) for use in differential metal etching should allow the following processes to be conducted simultaneously:

(a) etch Cr-Cu-Cr 66–70 down to a ceramic base 64 on which it is deposited in predetermined regions in a chlorine atmosphere (personality etching);

(b) at the same time that Cr-Cu-Cr 66–70 is being etched, etch the top Cr layer 70 alone in other regions (select etching); and (c) do not etch certain regions 71 at all.

Process (a) is accomplished in accordance with the method disclosed in U.S. Pat. Nos. 4,490,210 and 4,490,211 issued to Chen et al, assigned to the present assignee and hereby incorporated by reference. For differential metal etching, a chlorine pressure and laser repetition rate must be chosen, in addition to a light wavelength and etch rate (fluence).

It has been observed that the bottom Cr layer 66 is essentially vaporized once the Cu layer 68 is etched. (J. E. Andrew, P. E. Dyer, R. D. Greenough and P. H. Key, Appl. Phys. Lett., 43(11), 1 Dec., 1983, pp 1076–1078; and J. Bohandy, B. F. Kim and F. J. Adrian, J. Appl. Phys., 60(4), 15 August 1986, pp 1538, 1539 and references therein.) Since etching of the bottom Cr layer 66 requires an insignificant amount of time, the etch rate of the Cr-Cu-Cr is determined essentially by the etch rate of the top Cr layer 70 and the Cu layer 68 alone.

The time needed to etch all three metal layers ($t_p$) and the time needed to etch just the top Cr layer ($t_s$) should be equal. The etch times, $t_p$ and $t_s$, can be expressed in terms of the metal thicknesses and measured etch rates:

$$t_p = \frac{T_{Cu}}{R_{Cu}} + \frac{T_{Cr}}{R_{Cr}} \tag{1}$$

and $$t_s = \frac{T_{Cr}}{R'_{Cr}} \tag{2}$$

where $T_{Cu}$ is the thickness of the copper layer 68, $T_{Cr}$ is the thickness of the top Cr layer 70, $R_{Cu}$ is the etch rate of Cu, $R_{Cr}$ is the etch rate of Cr where personality etching occurs and $R'_{Cr}$ is the etch rate of Cr where select etching occurs.

Since $t_p$ and $t_s$ are equal, $$R'_{Cr} = \frac{T_{Cr}}{(T_{Cu}/R_{Cu}) + (T_{Cr}/R_{Cr})} \tag{3}$$

From the known thicknesses of the metals and the rates for personality etching, the rate for select etching can be determined. The ratio of the fluence needed for select etching, $\phi_s$, to the fluence needed for personality etching, $\phi_p$ have the following relationship:

$$T_s = T_p \frac{(\phi_s)}{(\phi_p)} \tag{4}$$

where $T_s$ is the transmission in the select etching area of the mask and $T_p$ is the transmission in the personality etching area of the mask.

For illustrative purposes and as one embodiment of the present invention, consider etching with a $Cl_2$ pressure of 500 mtorr, a laser repetition rate of 20 Hz and a fluence at the metal of 384 mJ/cm$^2$ in those areas where all three metal layers are to be etched. Assume that the metal thicknesses are $T_{Cu}$=80,000 Angstroms and $T_{Cr}$=800 Angstroms. At 384 mJ/cm$^2$ the Cu etch rate is 2,058 Angstroms/sec and the Cr etch rate is 95.9 Angstroms/sec. Substituting these values into equation (3) yields an etch rate for Cr in the select regions of approximately 17 Angstroms/sec, which corresponds to a fluence of 220 mJ/cm$^2$. The transmission in the select regions is $$T_s = \frac{(220)}{(384)} \times T_p = 0.573 \, T_p$$

If the area which corresponds to personality etching is simply bare synthetic fused silica, then $T_p$=0.955 and $T_s$=0.547. The reflectivity of the coating in the area of the mask which corresponds to select etching would then be $1-T_s$=0.453 or 45.3%.

Based on the above example a mask would be constructed as follows. Those regions of Cr-Cu-Cr which are not to be etched have corresponding totally reflecting areas on the mask. The areas of the mask that correspond to regions of the Cr-Cu-Cr where all the metal is to be removed are bare synthetic fused silica substrate without coating. The areas of the mask which correspond to select etching have a dielectric coating which is 45.3% reflective. If sufficient fluence is incident uniformly over the mask so that the fluence delivered on the metal in the personality etching areas is 384 mJ/cm$^2$, personality and select etching is accomplished simultaneously and is completed concurrently.

In practice, it is difficult to achieve reflectivity of exactly 45.3% because of the way in which the dielectric coatings are produced. Since the ceramic base 64 is resistant to laser damage, the calculated reflectance in the areas of the mask which correspond to select etching can actually be considered a lower bound. Any reflectivity greater than the calculated reflectivity for the select areas can be used as long as the fluence delivered to the select areas is above the threshold needed for select etching under the given conditions. If the reflectivity in the select areas is greater than the calculated value, it will be necessary to overetch in the personality etching areas. Since the ceramic 64 is resistant to laser damage, overetching in the personality region causes few problems. The reflectivity in the select areas should never be less than the calculated values to prevent overetching in the select areas and loss of considerable Cu therefrom.

Figure 4:
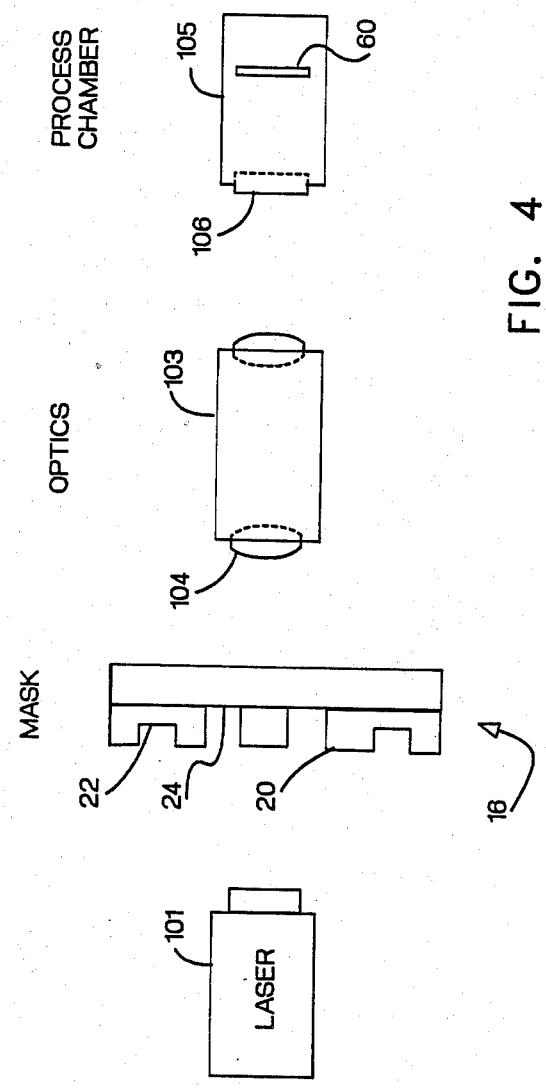
FIG. 4 is a cross-sectional schematic diagram of an etching apparatus in accordance with the present invention.

Referring now also to FIG. 4, there is shown a cross-sectional schematic diagram of apparatus for use in the method of the present invention.

A laser 101 is positioned so as to form an optical line with a mask 16, an optical imaging system 103 and a metallized base 60 to be etched. The base 60 is mounted in a reaction chamber 105. Laser 101 is a rare gas halide laser which is capable of emitting a characteristic wavelength which matches the absorption wavelength of the reaction product or the underlying material. One commercially available laser for purposes of this invention the LAMBDA PHYSIC EMG 201 model.

In operation, the mask 16 is transparent to the laser light in the region 24 where there is no dielectric, is opaque in the region 20, and is partially transparent in the region 22 where the dielectric is present. As a result, light from laser 101 is transmitted by the mask 16 in the pattern corresponding to the transparent and partially transparent regions thereof.

The imaging system 103 consists of at least one synthetic fused silica lens 104. The imaging system 103 images the patterned beam of laser radiation emerging from mask 16 onto the metallized base 60 for etching in conformance with the patterned laser beam.

It will be appreciated that while the etching system shown in FIG. 4 uses an image projection system 103 to effectively project the patterned beam of laser radiation onto the base 60, it is possible to dispense with the image system 103 when no volatile product is to be created (e.g., in the case of exposing, not etching, a photosensitive polymer) if a contact mask, placed in close proximity to the base 60, were utilized.

The reaction chamber 105 is a conventional vacuum chamber constructed from stainless steel. It has removable vacuum flanges, not shown, on each of four openings. One of the flanges is connected to a pump, not shown. The pump provides the necessary low pressure within the reaction chamber 105 during the etching process. One of the other flanges is provided with a window 106 for permitting laser light to enter the chamber 105. The window 106 is optically clear and distortion-free to ensure that the mask image projected thereon is transmitted without distortion to the base 60. One of the other flanges of the reaction chamber 105 is also provided with a tube, not shown, to permit introduction of reactive gas into the chamber 105. Suitable means, such as a sample holder, not shown, is mounted in the chamber 105 to accommodate the base 60 to be etched.

Figure 5:
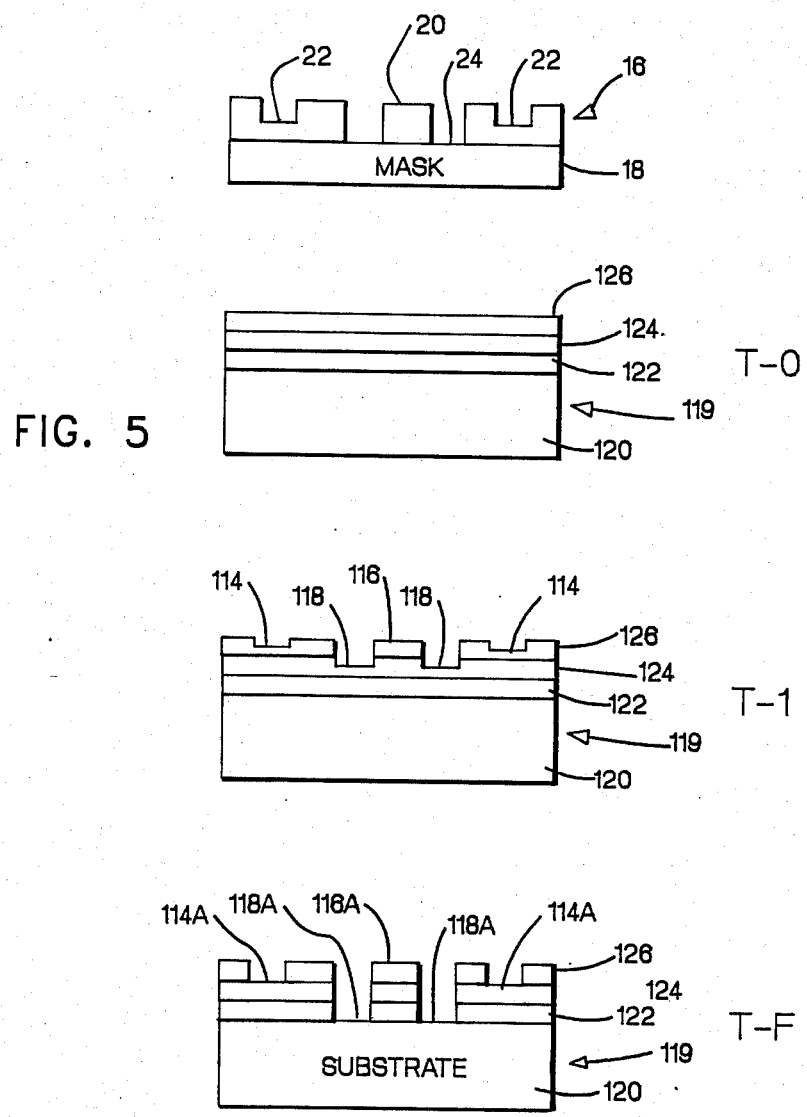
FIG. 5 is a schematic representation of stages of etching.

Referring now also to FIG. 5, there is shown a series of schematic representations of a substrate 119 being etched to three different levels successively over a period of time in accordance with the present invention. The mask assembly 16 has a layer of dielectric material disposed on a carrier 18. The first thin portion of the dielectric 22 covers at least part of the carrier 18 and the thicker portion of the dielectric 20 covers at least part of the thin portion 22.

Initially (time T−0), the base 120 of the substrate 119 has three complete, unetched layers disposed thereon: the first layer 122 being chromium; the second layer 124 being copper; and the uppermost layer 126 being chromium in the preferred multi-layer embodiment. When laser light, not shown, passes through the mask 16 under appropriate conditions and in conjunction with the process chamber 105 (FIG. 4) as hereinabove described, etching begins.

After a certain period (time T−1), portions of the uppermost two layers 124 and 126 are etched and removed. It can be seen that the central portions 118 are etched faster than a portion 114 of the top layer 126. This is due to the fact that the mask 16 has totally reflective and partially reflective portions corresponding to positions on the substrate 119. The absence of dielectric 24 on the mask 16 corresponds to the fastest etching areas 118 of the layers 122-126 of the substrate 119. Similarly, presence of the thickest portion of dielectric 20 of the mask 16 results in no etching of the corresponding location 116 on the substrate 119. The thin, and therefore partially reflective portion of dielectric 22 of the mask 16 results in etching only the top layer 126 of the substrate 119 corresponding to a position shown as reference numeral 114.

When the etching operation is complete (time T-F), the material of the three layers 122-126 remaining on the substrate 119 are etched to the desired degree. Thus, it can be seen that at the end of a given period of time, certain parts of the layers 114A disposed on the base 120 are etched in substantially the same time that combinations of these layers are etched 118A. In other words, both select and personality etching are accomplished simultaneously. Notwithstanding the differential etching of one layer and a combination of layers, portions of the substrate 116A, corresponding to totally reflective portions of the mask 20, are not etched at all.

Figure 6:
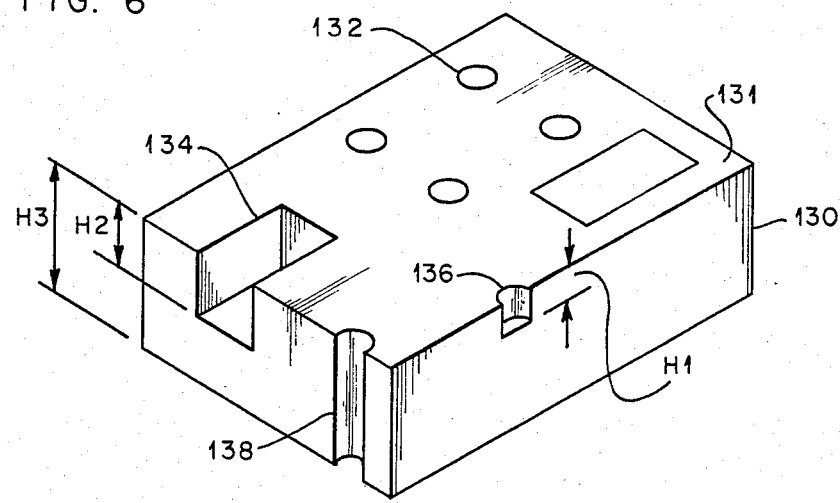
FIG. 6 is an isometric view of a substrate fabricated by using the method in accordance with the present invention.

Referring now also to FIG. 6, there is shown a cross-sectional isometric view of a substrate 130 comprising a substantially uniform block of etchable polymer such as polyimide.

The three dimensional view of the substrate 130 produced in accordance with the aforementioned method of the present invention is helpful in understanding the value of differential etching. The upper surface of the polyimide 130 is shown at reference numeral 131. Surface features 132, 134, 136 and 138 have been etched to varying depths by the use of a laser system. The features shown as reference numerals 132 and 136 represent viaduct holes or vias. Hole 136 has been etched to a depth of H1. The rectilinear circuit line structure 134 has been etched to a greater depth, H2. Finally, a thru hole 138 connects the upper surface of substrate 130 to the lower surface thereof. Thus, the thru hole 138 has been etched entirely through the thickness of the substrate 130, referred to as thickness H3.

For the surface features shown in FIG. 6, different areas are etched at different rates, depending upon the reflectivity of portions of an associated mask. The reflectivity of such portions of the mask are derived as follows.

A mask 16 (FIG. 1) for use in polyimide differential etching should satisfy the following three criteria:

(a) polyimide 130 is to be etched at a specified wavelength in air;

(b) two regions 138 and 134 of the polyimide 130 are to be etched simultaneously at two different respective rates $ER_1$ and $ER_2$ with $ER_1 > ER_2$; and (c) certain surface areas 131 of the polyimide 130 are not to be etched while the other areas 134 and 138 are being etched (i.e., a third etch rate $ER_3 = 0$).

Consider the problem of choosing the reflectivities of the dielectric material 14 (FIG. 1) so as to produce fluences on the polymide 130 which correspond to each rates of $ER_1$ and $ER_2$.

The first step is to measure the etch rate of the polyimide of interest 130 in air at 308 nm. As an example, the etch rate data collected by Brannon et al, supra, will be used. The etch rate versus fluence (energy per cm²) data follows a Beer-Lambert law. The etch rate per pulse is $$ER_i = \frac{\ln(\phi_i/\phi_t)}{\alpha} \qquad (6)$$

In equation (6) $\alpha$ is the polyimide absorption coefficient for 308 nm laser light and $\phi_t$ is the threshold fluence for etching polyimide at wavelength 308 nm. Both $\alpha$ and $\phi_t$ are functions only of the material being etched and the wavelength of light being used. $ER_i$ is the etch depth per pulse of the polyimide 130 at fluence $\phi_i$. Note that $\phi_i \geq \phi_t$ for etching to occur. Consider the difference between etch rates:

$$ER_1 - ER_2 = \frac{\ln(\phi_1/\phi_2)}{\alpha} \qquad (7)$$

Let $$X = \frac{ER_2}{ER_1} \qquad (8)$$

By substitution and rearrangement:

$$\frac{\phi_2}{\phi_1} = e^{(\alpha[1-X]ER_1)} \qquad (9)$$

Since $\phi_1$ is the fluence that reaches the polyimide 130 it is directly proportional to the amount of light transmitted by the corresponding part of the mask 16.

$$\frac{\phi_2}{\phi_1} = \frac{T_2}{T_1} \qquad (10)$$

Substituting and rearranging:

$$T_2 = T_1 e^{(-\alpha[1-X]ER_1)} \qquad (11)$$

Choose the desired etch rates $ER_1$ and $ER_2$ and measure the transmission of the mask 16 corresponding to the thru hole 138. Since $\alpha$ is known from the etch rate measurements, the transmission of the mask required to achieve etch rate $ER_2$ is given by equation (11).

As a specific example consider the case when $ER_1 = 1000$ Angstroms per pulse and $ER_2 = 600$ Angstroms per pulse. For this set of etch rates $X = 0.6$. From the work of Brannon et al, supra, $\alpha = 9.0 \times 10^{-4}$ Angstroms$^{-1}$.

To make maximum use of the available light, the reflective dielectric is completely removed from the area of the mask corresponding to the thru hole 138 on the polyimide 130. Reflection losses on other optical surfaces would attenuate light passing through all areas of the mask equally and would not affect the ratio of the etch rates. Thus the transmission through the one surface of the synthetic fused silica substrate 18 (FIG. 1) is $T_1$. A realistic value for the transmission of synthetic fused silica is 95.5% per surface. Setting $T_1 = 0.955$ and substituting into equation (11) results in a value for $T_2$ of 0.666.

The reflectivity of the remaining coating 22 on the mask 16 is $1 - T_2 = 1 - 0.666 = 0.334$ or 33.4%. For this example, the mask 16 is constructed such that certain areas 20 of the mask 16 are totally reflecting at wavelength 308 nm. In areas 24 of the mask 16 which correspond to etching at 1000 Angstroms/pulse, all coatings are removed; only the synthetic fused silica substrate 18 remains. Finally, in areas 22 of the mask 16, only a dielectric coating with reflectivity of 33.4% at wavelength 308 nm remains.

The discussion hereinabove relates only to creating a mask to allow etching of polyimide 130 simultaneously at two rates. The above referenced data collected by Brannon et al, supra, identifies the fluence to be delivered to the polyimide 130 in order to achieve a certain etch rate. Losses in the optical system 103 (FIG. 4) occur after light has passed through the face of the mask 16 on which the image has been ion milled in the dielectric. In order to compensate for the losses in the optical system 103, the fluence incident on the mask 16 must be greater than the fluence needed to etch polyimide 130 at a given rate. It is not possible to determine the fluence to be delivered to the mask to achieve a given etch rate unless losses in the optical system are known. However, if sufficient uniform fluence is delivered to the mask 16 in the above example so that the polyimide etch rate at reference numeral 138 is 1000 Angstroms/pulse, the etch rate at reference numeral 134 is 600 Angstroms/pulse and no etching occurs at the surface 131.

In practice, it is unlikely that a reflectivity of exactly 33.4% can be obtained because of the way in which the dielectric coatings are produced. It will be necessary in such instances to decide whether a slightly higher reflectivity (lower etch rate) or a slightly lower reflectivity (higher etch rate) is best to use. In one case, it is clearly best to use a reflectivity greater than optimal. That case occurs when the polyimide 130 at the thru hole 138 is etched to expose a substrate, not shown, that is resistant to laser damage. In this special case, the reflectivity calculated hereinabove is a lower limit to the reflectivity which is actually used, since a lower etch rate (higher reflectivity) can be used to obtain the correct etch depth at surface feature 134 by using additional laser pulses. Overetching will not affect the thru hole 138 since the substrate is resistant to laser damage.

It can be seen that circuit boards or semiconductor features can be etched to varying depths simultaneously by the use of the present invention. It should be noted that, while three different depths of etching are shown in FIG. 6, other depths can also be created by modifying the structure of the mask 16 (FIG. 1) in a suitable manner. For example, any number of dielectric layers, with or without endpoint detection, can be fabricated in a mask which, in turn, can be used to manufacture a substrate.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A method for performing differential etching of material by using electromagnetic radiation, the steps comprising:
    (a) generating a beam of electromagnetic radiation;
    (b) providing material to be selectively etched, said material having two predetermined regions; and
    (c) selectively varying the energy intensity of predetermined areas within said beam of electromagnetic radiation so that both of said predetermined regions of said material are etched simultaneously and each of said predetermined regions is etched at a rate independent of the etching rate of the other of said predetermined regions.

2. The method in accordance with claim 1 wherein at least one of said regions of said material to be etched comprises an electrical conductor.

3. The method in accordance with claim 2 wherein said electrical conductor forms part of an electrical circuit.

4. The method in accordance with claim 1 wherein said material is an etchable polymer.

5. The method in accordance with claim 1 wherein said beam of electromagnetic radiation is generated by a laser.

6. The method in accordance with claim 1 wherein said energy intensity of predetermined areas with said beam is caused to vary by means of a mask.

7. The method in accordance with claim 6 wherein said mask comprises:
    (a) a first portion having a first predetermined reflectivity property; and
    (b) a second portion having a second predetermined reflectivity property.

8. The method in accordance with claim 7 wherein said mask further comprises:
    (c) a substantially transparent carrier having a third predetermined reflectivity property.

9. A method for performing differential etching of a substance by using electromagnetic radiation, the steps comprising:
    (a) generating a beam of electromagnetic radiation;
    (b) providing a substance to be selectively etched, said substance being in operative relation to said beam of electromagnetic radiation, said substance comprising two materials, each of said materials having a different etch rate; and
    (c) selectively varying the energy intensity of predetermined areas within said beam of electromagnetic radiation so that each of said materials is etched substantially simultaneously.

10. The method in accordance with claim 9 wherein at least one of said regions of said material to be etched comprises an electrical conductor.

11. The method in accordance with claim 10 wherein said electrical conductor forms part of an electrical circuit.

12. The method in accordance with claim 9 wherein at least one of said materials is an etchable polymer.

13. The method in accordance with claim 9 wherein at least one of said materials is an etchable semiconductor.

14. The method in accordance with claim 9 wherein said beam of electromagnetic radiation is generated by a laser.

15. The method in accordance with claim 9 wherein said energy intensity of predetermined areas with said beam is caused to vary by means of a mask.

16. The method in accordance with claim 15 wherein said mask comprises:
    (a) a first portion having a first predetermined reflectivity property; and
    (b) a second portion having a second predetermined reflectivity property.

17. The method in accordance with claim 16 wherein said mask further comprises:

(c) a substantially transparent carrier having a third predetermined reflectivity property.

18. A method for performing differential etching of a substance by using electromagnetic radiation, the steps comprising:
   (a) generating a beam of electromagnetic radiation;
   (b) providing a substance to be selectively etched, said substance comprising at least two materials; and
   (c) selectively varying the energy intensity of predetermined areas within said beam of electromagnetic radiation so that the time required to etch one of said materials is substantially equal to the time required to etch any selected combination of said materials remaining.

19. The method in accordance with claim 18 wherein at least one of said regions of said material to be etched comprises an electrical conductor.

20. The method in accordance with claim 19 wherein said electrical conductor comprises chromium.

21. The method in accordance with claim 20 wherein said electrical conductor comprises copper.

22. The method in accordance with claim 18 wherein said electrical conductor forms part of an electrical circuit.

23. The method in accordance with claim 18 wherein said beam of electromagnetic radiation is generated by a laser.

24. The method in accordance with claim 18 wherein said energy intensity of predetermined areas with said beam is caused to vary by means of a mask.

25. The method in accordance with claim 24 wherein said mask comprises:
   (a) a first portion having a first predetermined reflectivity property; and
   (b) a second portion having a second predetermined reflectivity property.

26. The method in accordance with claim 25 wherein said mask further comprises:
   (c) a substantially transparent carrier having a third predetermined reflectivity property.

27. A method of making a mask for use in a photolithographic process, the steps comprising:
   (a) providing a substantially transparent carrier;
   (b) coating said carrier with a totally reflecting dielectric, said dielectric being resistant to high fluence at a predetermined operating wavelength;
   (c) applying, baking, exposing and developing a personality pattern in a first photoresist;
   (d) ion milling said exposed dielectric to said carrier;
   (e) stripping said first photoresist;
   (f) applying, baking, exposing and developing a select pattern in a second photoresist so that said dielectric in said select pattern is exposed;
   (g) ion milling said dielectric in said select pattern to a predetermined level; and
   (h) stripping said second photoresist.

28. A method of making a mask for use in a photolithographic process, the steps comprising:
   (a) providing a substantially transparent carrier;
   (b) coatinq said carrier with a reflecting dielectric, said dielectric being resistant to high fluence at a predetermined operating wavelength;
   (c) applying, baking, exposing and developing a personality pattern in a first photoresist so that the exposed dielectric is the complement of said personality pattern;
   (d) ion milling said complement of said personality pattern to a predetermined level;
   (e) stripping said first photoresist;
   (f) applying, baking, exposing and developing a pattern representative of said personality pattern less a select portion thereof in a second photoresist;
   (g) ion milling said exposed dielectric in said select pattern and in said complement of said personality pattern until said dielectric is substantially completely removed from said complement of said personality pattern; and
   (h) stripping said second photoresist.

29. A method of making a mask for use in a photolithographic process, the steps comprising:
   (a) providing a substantially transparent carrier;
   (b) coating said carrier with three layers, the first of said layers being a dielectric adjacent to said carrier, said first layer having a partial transmission characteristic for a predetermined operating wavelength, and the third of said layers being a reflecting dielectric;
   (c) applying, baking, exposing and developing a personality pattern in a first photoresist;
   (d) ion milling said third layer, etching said second layer and ion etching said first layer to expose said carrier;
   (e) stripping said first photoresist;
   (f) applying, baking, exposing and developing a select pattern in a second photoresist;
   (g) ion milling said third layer and etching said second layer in said select pattern; and
   (h) stripping said second photoresist.

30. The method of making a mask in accordance with claim 29 wherein said second layer comprises a metal.

31. The method of making a mask in accordance with claim 30 wherein said second layer metal comprises chromium.

32. The method of making a mask in accordance with claim 30 wherein said second layer metal comprises aluminum.

33. The method of making a mask in accordance with claim 29 wherein said third layer is a dielectric capable of reflecting substantially all radiation of a predetermined wavelength.

34. A mask comprising:
   (a) a first portion having a first predetermined reflectivity property;
   (b) a second portion having a second predetermined reflectivity property; and
   (c) a transparent carrier having a third predetermined reflectivity property.

35. A method for performing differential exposure of material by using electromagnetic radiation, the steps comprising:
   (a) generating a beam of electromagnetic radiation;
   (b) providing material to be selectively exposed, said material having two predetermined regions; and
   (c) selectively varying the energy intensity of predetermined areas within said beam of electromagnetic radiation so that both of said predetermined regions of said material are exposed simultaneously and each of said predetermined regions is exposed to a degree independent of the degree of exposure of the other of said predetermined regions.

36. The method in accordance with claim 35 wherein said material comprises a photosensitive polymer.

37. The method in accordance with claim 35 wherein at least one of said regions of said material to be exposed comprises an etchable semiconductor.

38. The method in accordance with claim 18 wherein at least a portion of said substance to be selectively etched comprises layers of material.

39. The method in accordance with claim 38 wherein one of said layers of material comprises copper and two of said layers of material comprise chromium, wherein said chromium layers are interleaved with said copper layer.

* * * * *